(12) United States Patent
Shikama et al.

(10) Patent No.: US 11,393,737 B2
(45) Date of Patent: Jul. 19, 2022

(54) ELECTRONIC EQUIPMENT

(71) Applicant: Sony Interactive Entertainment Inc., Tokyo (JP)

(72) Inventors: Kazuyuki Shikama, Tokyo (JP); Morio Usami, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 16/612,509

(22) PCT Filed: May 18, 2018

(86) PCT No.: PCT/JP2018/019358
§ 371 (c)(1),
(2) Date: Nov. 11, 2019

(87) PCT Pub. No.: WO2018/216627
PCT Pub. Date: Nov. 29, 2018

(65) Prior Publication Data
US 2020/0126884 A1  Apr. 23, 2020

(30) Foreign Application Priority Data
May 22, 2017  (JP) .............................. JP2017-101257

(51) Int. Cl.
*H01L 23/367*  (2006.01)
*H05K 1/02*  (2006.01)
*H05K 7/20*  (2006.01)

(52) U.S. Cl.
CPC ....... *H01L 23/3677* (2013.01); *H05K 1/0206* (2013.01); *H05K 7/205* (2013.01)

(58) Field of Classification Search
CPC ............ H01L 23/3677; H01L 2924/14; H01L 23/5389; H05K 1/0206; H05K 7/205;
(Continued)

(56) References Cited

U.S. PATENT DOCUMENTS 5,920,458 A * 7/1999 Azar .................... H01L 23/3677
174/252
6,190,941 B1 * 2/2001 Heinz ................. H01L 23/3677
438/106
(Continued)

FOREIGN PATENT DOCUMENTS

JP          0982857 A     3/1997
JP       2001284748 A    10/2001
(Continued)

OTHER PUBLICATIONS

International Search Report for corresponding PCT Application No. PCT/JP2018/019358, 4 pages, dated Aug. 7, 2018.
(Continued)

Primary Examiner — Michael A Matey
(74) Attorney, Agent, or Firm — Matthew B. Dernier, Esq.

(57) ABSTRACT

A heatsink (21) is disposed on a lower surface of a circuit board (10). The circuit board (10) has through holes (h1) that penetrate the circuit board (10) in an area (A) where an integrated circuit apparatus (5) is disposed. Heat conduction paths (11) are provided in the through holes (h1). The heat conduction paths (11) connect the integrated circuit apparatus 5 and the heatsink (21). This structure allows for disposition of a component different from the heatsink (21) on the same side as the integrated circuit apparatus (5), thus ensuring a higher degree of freedom in a component layout.

13 Claims, 8 Drawing Sheets

(58) Field of Classification Search
CPC ............... H05K 1/0204; H05K 1/113; H05K 2201/066; H05K 3/341; H05K 7/20854; H05K 1/0203; H05K 1/023; H05K 1/144; H05K 1/183; H05K 1/021; H05K 1/181; H05K 1/186; H05K 2201/09563; H05K 3/0058; H05K 3/0061; H05K 7/2039; H05K 7/20436; H05K 7/209

See application file for complete search history.

(56) References Cited

U.S. PATENT DOCUMENTS

| | | | | |
|---|---|---|---|---|
| 6,373,348 | B1* | 4/2002 | Hagerup | H01L 23/3677 257/E23.105 |
| 6,477,054 | B1* | 11/2002 | Hagerup | H01L 23/3677 174/262 |
| 7,054,156 | B2 | 5/2006 | Espinoza-Ibarra et al. | |
| 2001/0026441 | A1* | 10/2001 | Nakamura | H01L 23/3677 361/720 |
| 2002/0162678 | A1* | 11/2002 | Takano | H05K 7/205 174/384 |
| 2003/0184969 | A1* | 10/2003 | Itabashi | H01L 23/3677 361/688 |
| 2004/0136162 | A1* | 7/2004 | Asai | H05K 7/20445 361/715 |
| 2004/0233642 | A1* | 11/2004 | Ito | H01L 23/42 361/720 |
| 2006/0284304 | A1* | 12/2006 | Caletka | H01L 23/3128 257/700 |
| 2008/0080142 | A1* | 4/2008 | Chen | H05K 1/0204 361/710 |
| 2008/0130234 | A1* | 6/2008 | Maehara | H05K 7/205 361/704 |
| 2009/0002950 | A1* | 1/2009 | Gertiser | H05K 7/205 361/709 |
| 2009/0040727 | A1* | 2/2009 | Decker | H05K 1/0204 361/705 |
| 2011/0205702 | A1* | 8/2011 | Grajcar | H05K 1/0204 361/692 |
| 2013/0083504 | A1* | 4/2013 | Fukuzono | H01L 23/4006 361/783 |
| 2014/0063747 | A1* | 3/2014 | Sotome | H05K 7/209 361/720 |
| 2015/0029674 | A1* | 1/2015 | Ko | H05K 1/0206 361/720 |
| 2016/0129792 | A1* | 5/2016 | Gohara | B23P 15/26 310/54 |
| 2017/0243854 | A1* | 8/2017 | Sugiyama | H01L 21/4853 |
| 2017/0339790 | A1* | 11/2017 | Wittmann | H05K 3/321 |
| 2018/0331012 | A1* | 11/2018 | Shimakawa | B62D 5/0481 |
| 2019/0335577 | A1* | 10/2019 | Gotz | H05K 1/0204 |
| 2020/0303322 | A1* | 9/2020 | Sakuma | H05K 1/0271 |

FOREIGN PATENT DOCUMENTS

| | | |
|---|---|---|
| JP | 2002118384 A | 4/2002 |
| JP | 2013105904 A | 5/2013 |
| JP | 2013222275 A | 10/2013 |
| JP | 2014036033 A | 2/2014 |
| JP | 2015133373 A | 7/2015 |
| JP | 2016111117 A | 6/2016 |

OTHER PUBLICATIONS

International Preliminary Report on Patentability and Written Opinion for corresponding PCT Application No. PCT/JP2018/019358, 16 pages, dated Dec. 5, 2019.

* cited by examiner

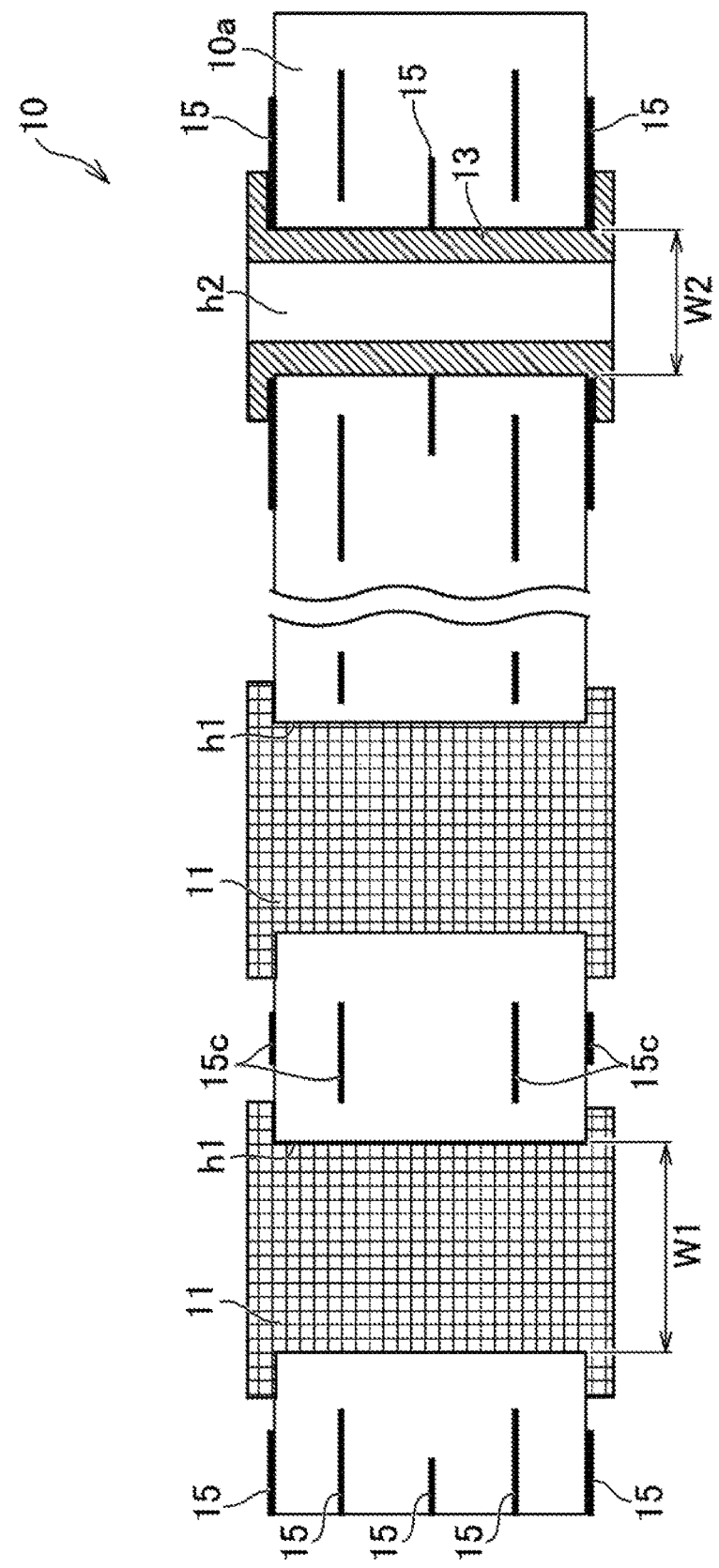

ELECTRONIC EQUIPMENT

TECHNICAL FIELD

The present invention relates to a cooling structure for heat generating components of electronic equipment.

BACKGROUND ART

In some cases, in electronic equipment, a heat radiating apparatus such as a heatsink or a heat pipe is connected to an integrated circuit apparatus such as a central processing unit (CPU) or a graphics processing unit (GPU). In conventional electronic equipment, an integrated circuit apparatus is disposed on an upper side of a circuit board with a heat radiating apparatus provided above the integrated circuit apparatus (e.g., Japanese Patent Laid-Open No. 2013-222275).

SUMMARY

In conventional electronic equipment, there have been cases in which the heat radiating apparatus constitutes a constraint in laying out other components and in which a cooling structure increases in size to provide sufficient cooling performance.

Electronic equipment proposed in the present disclosure includes a circuit board, a heat radiating apparatus, and heat conduction paths. The circuit board has first and second surfaces and through holes. An electronic component is disposed on the first surface. The second surface is on the opposite side of the first surface. The circuit board has through holes formed in an area where the electronic component is disposed. The heat radiating apparatus is disposed on the second surface of the circuit board and is located on the opposite side of the electronic component with the circuit board provided therebetween. The heat conduction paths are provided in the through holes of the circuit board and connect the electronic component and the heat radiating apparatus. The electronic equipment ensures a higher degree of freedom in a component layout or enhances cooling performance for the electronic component.

BRIEF DESCRIPTION OF DRAWINGS

FIG. 2A is an enlarged sectional view of a circuit board included in the electronic equipment illustrated in FIG. 1.

DESCRIPTION OF EMBODIMENT

A description will be given below of an embodiment of electronic equipment proposed in the present disclosure. In the description given below, directions indicated by Z1 and Z2 in FIG. 1 will be referred to as upper and lower, respectively. In the description given below, the terms "upper," "lower," "upper side," "lower side," and so on are used to indicate a relative positional relationship between components, members, and elements of the electronic equipment. These terms do not restrict postures of the components and so on in the electronic equipment or the posture of the electronic equipment.

Figure 1:
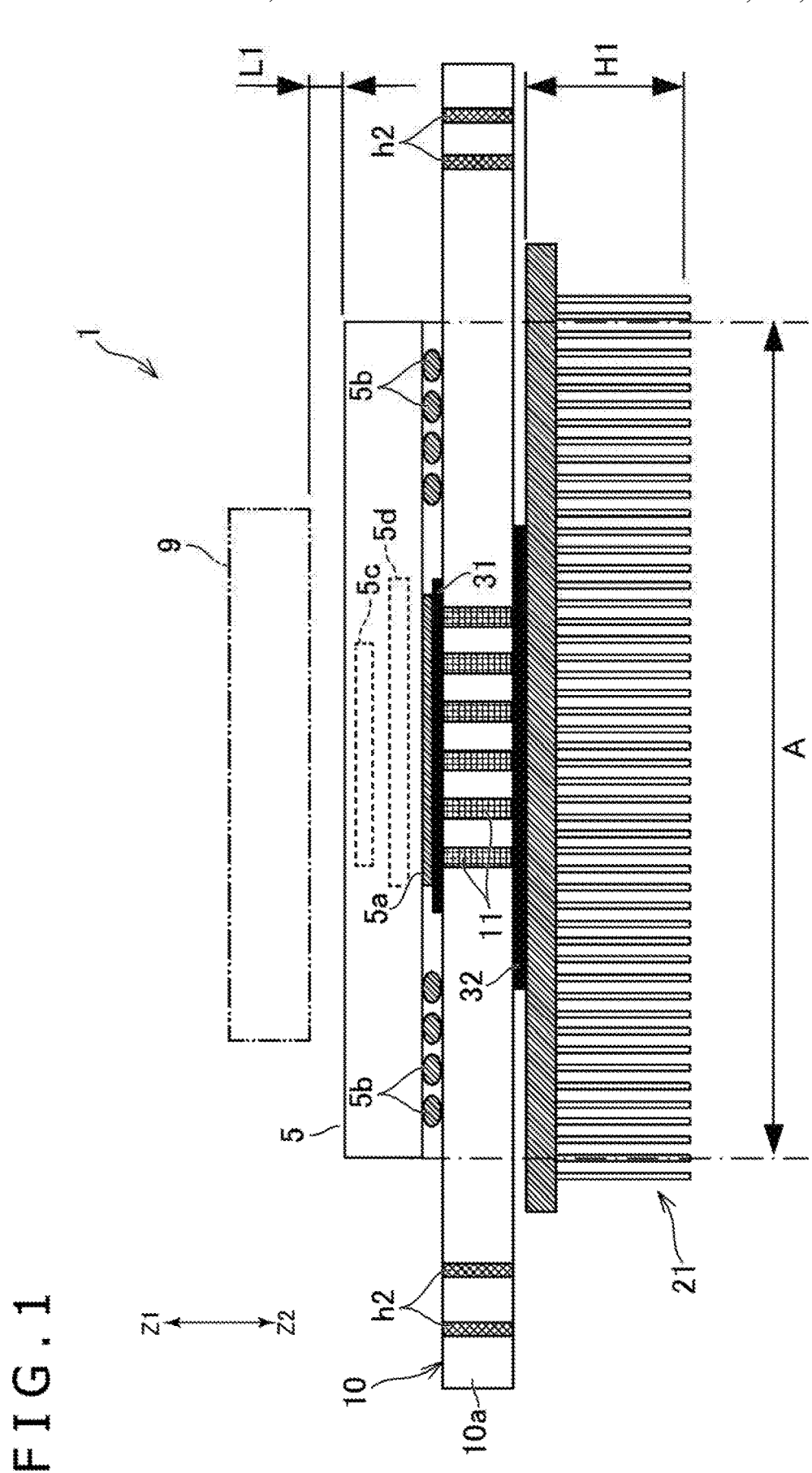
FIG. 1 is a schematic sectional view illustrating an example of electronic equipment proposed in the present disclosure.

As illustrated in FIG. 1, electronic equipment 1 has a circuit board 10. The circuit board 10 has a base material 10a that includes, for example, an insulating material such as paper phenol, glass epoxy resin, and so on. Circuit patterns 15 (refer to FIG. 2A) are formed in the base material 10a. The circuit board 10 is a multi-layer board having a plurality of layers with the circuit pattern 15 formed in each layer. The circuit board 10 may not be a multi-layer board. For example, the circuit board 10 may be a double-sided board having the circuit pattern 15 only on its upper and lower surfaces. Alternatively, the circuit board 10 may be a one-sided board with the circuit pattern 15 formed only on its upper surface (surface on which an integrated circuit apparatus or another component is mounted).

In the example of the electronic equipment 1, the circuit board 10 has a hole h2 that connects the plurality of circuit patterns 15 with each other as illustrated in FIG. 2A (the hole h2 will be referred to as a "connecting hole"). A conductor 13 is formed inside the connecting hole h2, and the plurality of circuit patterns 15 are electrically connected to each other via the conductor 13. For example, the inside of the connecting hole h2 is metal-plated. Although the conductor 13 has a tubular shape in the example of the electronic equipment 1, the conductor 13 may be formed in such a manner as to fill the connecting hole h2. The connecting hole h2 is, for example, a through hole that penetrates the circuit board 10 as illustrated in FIG. 2A. Unlike this, the connecting hole h2 may be a recess that does not penetrate the circuit board 10. The circuit board 10 further has through holes h1 for forming heat conduction paths 11 which will be described later.

As illustrated in FIG. 1, an electronic component is disposed on the upper surface (first surface) of the circuit board 10. The electronic component is, for example, a heat generating component that generates heat during operation. In the example of the electronic equipment 1, an integrated circuit apparatus 5, which is a heat generating component, is disposed on the circuit board 10. The integrated circuit apparatus 5 is, for example, a microprocessor, a memory, an analog signal processing circuit, or other components but is not limited thereto. Also, the integrated circuit apparatus 5 may be a system in package (Sip) having a plurality of integrated circuit (IC) chips (silicon die) sealed inside a single package. In this case, the integrated circuit apparatus 5 may be a Sip having a plurality of IC chips arranged horizontally side by side or a Sip having a plurality of IC chips arranged vertically side by side. In the example illustrated in FIG. 1, the integrated circuit apparatus 5 has two IC chips 5c and 5d that are vertically stacked one on top of the other. An electronic component susceptible to temperature effects may be disposed on the circuit board 10 in place of the integrated circuit apparatus 5. Examples of such an electronic component may be a sensor, a light emitting diode (LED), an inverter, a motor, and so on.

The integrated circuit apparatus 5 is a surface-mounted component with a plurality of terminals connected to electrode pads 16 (refer to FIG. 2B) formed on the surface of the circuit board 10. In the example of the electronic equipment 1, the integrated circuit apparatus 5 is a ball grid array (BGA) type with a plurality of solder balls 5b (refer to FIG. 1) on its lower surface. The solder balls 5b are each connected to the electrode pad 6. It should be noted that the integrated circuit apparatus 5 may not be a BGA type. For example, the integrated circuit apparatus 5 may have a plurality of lead terminals connected to the circuit board 10 on its outer circumferential edge rather than the solder balls. In still another example, the integrated circuit apparatus 5 may be an insertion-mounted component having terminals inserted into holes formed in the circuit board 10 and soldered.

A heat radiating apparatus is disposed on the lower surface (second surface) of the circuit board 10. As illustrated in FIG. 1, in the example of the electronic equipment 1, a heatsink 21 is disposed on the lower surface of the circuit board 10. The heatsink 21 is located on the opposite side of the integrated circuit apparatus 5 with the circuit board 10 provided therebetween. That is, when viewed from top, the heatsink 21 is disposed in such a manner as to overlap the integrated circuit apparatus 5. The circuit board 10 has the through holes h1 (refer to FIG. 2A) that penetrate the circuit board 10 in an area A where the integrated circuit apparatus 5 is disposed. The area A is sized for fitting outer dimensions of the integrated circuit apparatus 5. That is, the area A refers to an area immediately under the integrated circuit apparatus 5. In other words, the area A overlaps the integrated circuit apparatus 5 when the circuit board 10 is viewed from top. The through holes h1 stretch from the upper surface of the circuit board 10 to the lower surface thereof. The heat conduction paths 11 are provided in the through holes h1. In the example of the electronic equipment 1, in the circuit board 10, the plurality of through holes h1 are formed in the area A, and the heat conduction paths 11 are provided in each of the through holes h1. The heat conduction paths 11 connect the integrated circuit apparatus 5 and the heatsink 21, and heat is conducted from the integrated circuit apparatus 5 to the heatsink 21 via the heat conduction paths 11. The heat conduction paths 11 include a material having a higher thermal conductivity than the base material 10a of the circuit board 10.

This structure of the electronic equipment 1 eliminates the need for a space for a heat radiating apparatus on the upper side of the integrated circuit apparatus 5 as illustrated in FIG. 1, thus making it possible to dispose another component 9 (e.g., a transmission/reception module with an antenna and so on, a sensor, an external storage apparatus) of the electronic equipment 1 on the upper side of the integrated circuit apparatus 5 and ensuring a higher degree of freedom in laying out the component 9. In the example of the electronic equipment 1, the component 9 is disposed on the opposite side of the heatsink 21 with the circuit board 10 and the integrated circuit apparatus 5 provided therebetween. That is, the component 9 is disposed close to the upper side of the integrated circuit apparatus 5. Specifically, a distance L1 between the component 9 and the integrated circuit apparatus 5 is smaller than a height H1 of the heatsink 21. Unlike the example of the electronic equipment 1, another heat radiating apparatus may be provided on the upper surface of the integrated circuit apparatus 5. As a result, two heat radiating apparatuses are provided on the integrated circuit apparatus 5, thus providing improved cooling performance.

The heatsink 21 is attached to the circuit board 10. The heatsink 21 is fastened to the circuit board 10 with a fastener such as a screw or a bolt. The heatsink 21 may be soldered to the circuit board 10.

It should be noted that a heat pipe may be disposed on the lower surface of the circuit board 10 as a heat radiating apparatus in place of or together with the heatsink 21. Then, the heat conduction paths 11 may connect the heat pipe and the integrated circuit apparatus 5.

As described above, the circuit board 10 has an electric circuit. The electric circuit includes the circuit patterns 15 and the conductor 13 of the connecting hole h2 described above. The heat conduction paths 11 is formed of, for example, the same material as the conductor 13. In this case, the heat conduction paths 11 can be formed by the same process (plating process) as the conductor 13 during manufacture of the circuit board 10. The heat conduction paths 11 may be formed of the same material as the circuit patterns 15. In this case, the heat conduction paths 11 can be formed by the same process as the circuit patterns 15 during manufacture of the circuit board 10. It should be noted that the conductor 13 and the circuit patterns 15 may be formed of the same material. The circuit patterns 15, the conductor 13, and the heat conduction paths 11 include, for example, copper.

The heat conduction paths 11 may include a material different from that of the electric circuit. For example, the heat conduction paths 11 may include a material having a higher electric resistance than that of the electric circuit. This prevents the heat conduction paths 11 and the heatsink 21 connected thereto from causing electronic magnetic interference (EMI). The circuit patterns 15 include a conductive material (e.g., copper), and the heat conduction paths 11 include, for example, a metal having a higher electric resistance than copper. The heat conduction paths 11 may include an insulating material. For example, the heat conduction paths 11 may include thermal grease (also referred to as "heat radiating grease"). The thermal grease is grease such as silicone, which includes a highly thermally conductive filler (e.g., copper, silver, or aluminum particles). The thermal grease is filled into the through holes h1, thus forming the heat conduction paths 11.

As illustrated in FIG. 2A, in the example of the electronic equipment 1, the material of the heat conduction paths 11 fills the through holes h1, and the heat conduction paths 11 are columnar. This ensures efficient heat conduction from the integrated circuit apparatus 5 to the heatsink 21. The heat conduction paths 11 are not limited in structure to the example illustrated in FIG. 2A. FIG. 3 is a diagram illustrating another example of the heat conduction paths 11 (in FIG. 3, the same components as those in FIG. 2A are denoted by the same reference signs). As illustrated in FIG. 3, the heat conduction paths 11 may be tubular paths formed along inner surfaces of the through holes h1.

The heat conduction paths 11 illustrated in FIGS. 2A and 3 can be formed by a plating process conducted during manufacture of the circuit board 10. The heat conduction paths 11 can be, for example, formed by a plating process for forming the conductor 13 of the connecting hole h2. The method for forming the heat conduction paths 11 is not limited to a plating process. For example, the heat conduction paths 11 may be pins formed separately from the manufacture of the circuit board 10. In another example, the heat conduction paths 11 may be formed as described above by pouring thermal grease into the through holes h1. In still another example, the heat conduction paths 11 may be formed integrally with the heatsink 21. That is, part of the heatsink 21 may be inserted into the through holes h1, so that part thereof functions as the heat conduction paths 11.

Figure 2B:
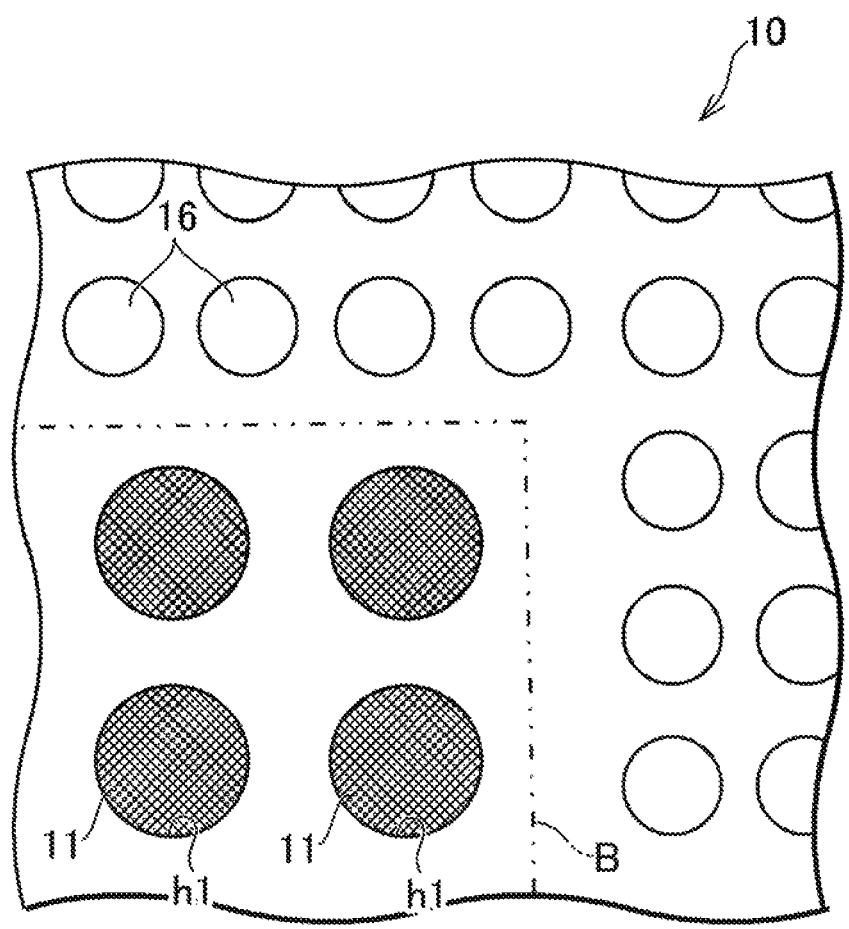
FIG. 2B is a plan view illustrating an area where heat conduction paths illustrated in FIG. 2A are formed.
Figure 3:
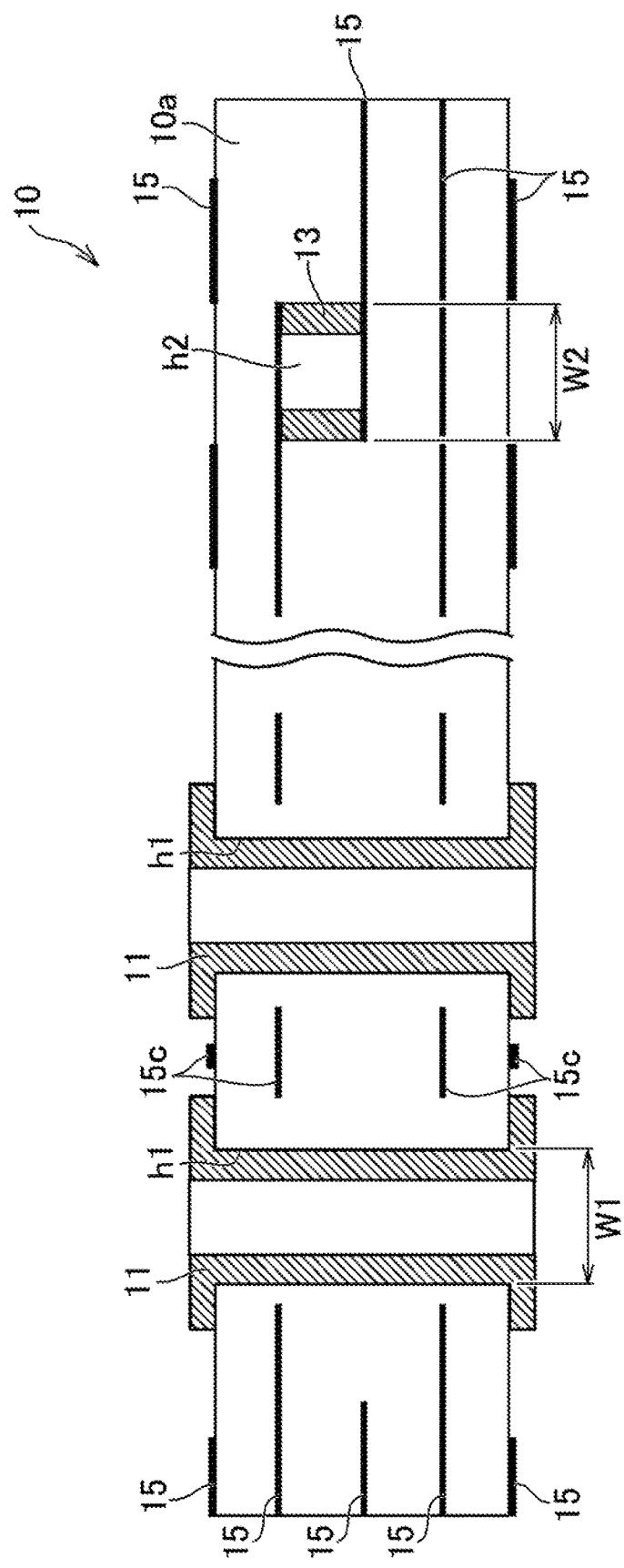
FIG. 3 is a sectional view illustrating a modification example of the heat conduction paths formed in the circuit board illustrated in FIG. 2A.

As illustrated in FIG. 2B, the through holes h1 are, for example, circular when the circuit board 10 is viewed from top. This allows for formation of the through holes h1 with greater ease during manufacture of the circuit board 10 than in the case where the through holes h1 are rectangular. It should be noted that the through holes h1 are not limited in shape to being circular. For example, the through holes h1 may be long holes when the circuit board 10 is viewed from top.

As described above, the connecting hole h2 for connecting the plurality of circuit patterns 15 is formed in the circuit board 10. As illustrated in FIG. 2A, a width W1 (diameter) of the through hole h1 may be greater than a width W2 (diameter) of the connecting hole h2. This ensures improved heat conduction efficiency from the integrated circuit apparatus 5 to the heatsink 21.

The through holes h1 are not limited in size to the example illustrated in FIG. 2A. For example, as illustrated in FIG. 3, the width W1 (diameter) of the through hole h1 may be substantially the same as the width W2 (diameter) of the connecting hole h2. This makes it possible to use the same tool in a drilling process for forming the connecting hole h2 and the through holes h1 during manufacture of the circuit board 10, thus simplifying the manufacture of the circuit board 10. The connecting hole h2 illustrated in FIG. 3 does not penetrate the circuit board 10. The connecting hole h2 connects the two circuit patterns 15 formed inside the circuit board 10.

As described above, the plurality of through holes h1 are formed in the circuit board 10. In the example illustrated in FIG. 2B, the plurality of through holes h1 are disposed in a grid pattern. That is, the plurality of through holes h1 are arranged side by side vertically and horizontally at equal intervals. As illustrated in FIG. 2A, electric wires 15c partially included in the circuit patterns 15 may be formed between the two adjacent through holes h1. In other words, the through holes h1 may be laid out in such a manner as to avoid the electric wires of the circuit patterns 15.

Figure 4:
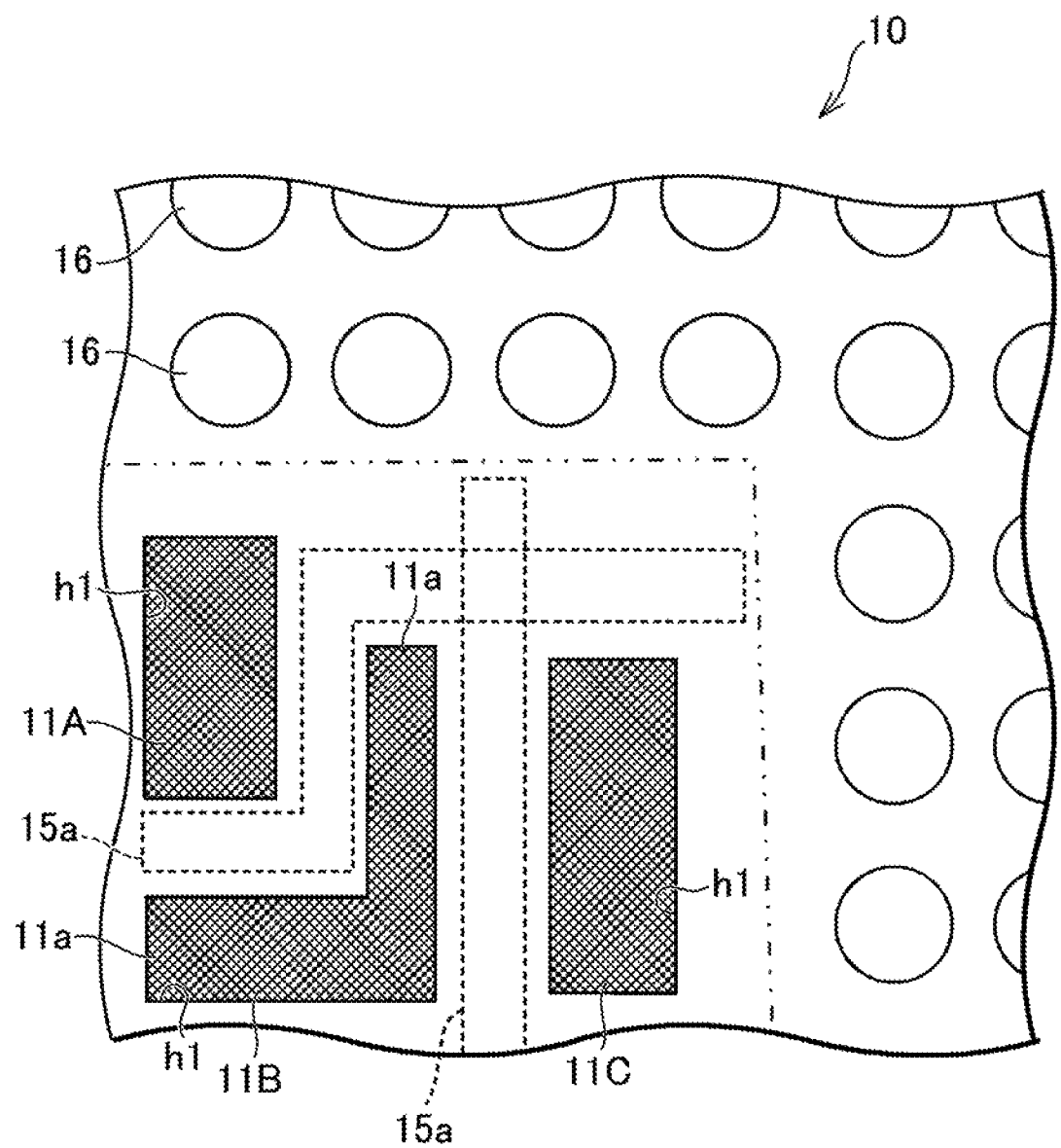
FIG. 4 is a plan view illustrating another modification example of the heat conduction paths illustrated in FIG. 2A.

FIG. 4 is a plan view illustrating a modification example of the heat conduction paths 11. In the example illustrated in FIG. 4, the circuit board 10 has a plurality of heat conduction paths 11A, 11B, and 11C. An electric wire 15a included in part of the circuit pattern 15 is formed between each pair of the adjacent heat conduction paths 11A, 11B, and 11C. The heat conduction paths 11A, 11B, and 11C differ in shape and/or size when the circuit board 10 is viewed from top. Specifically, while the heat conduction paths 11A and 11C are rectangular, the heat conduction path 11B is in the shape of a letter L. The heat conduction path 11B is bent to match the electric wire 15a. The shapes of the heat conduction paths 11A, 11B, and 11C may be changed as appropriate to match the shapes of the circuit patterns 15. Also, tip portions 11a of the heat conduction paths 11A, 11B, and 11C (tip portions of the through holes h1) may be formed to be circular. This facilitates, for example, the formation of the through holes h1 where the heat conduction paths 11A, 11B, and 11C are formed.

As illustrated in FIG. 1, the integrated circuit apparatus 5 has a heat conduction pad 5a on its lower surface. Although the solder balls 5b are formed on the outside of the heat conduction pad 5a in the example of the integrated circuit apparatus 5, the position of the heat conduction pad 5a is not limited thereto. When the integrated circuit apparatus 5 is viewed from the bottom, the heat conduction pad 5a is larger in size than the terminals used to send and receive signals such as the solder balls 5b. The heat conduction paths 11 are connected to the heat conduction pad 5a of the integrated circuit apparatus 5. In the example of the electronic equipment 1, the plurality of heat conduction paths 11 are located in an area B (refer to FIG. 2B) of the heat conduction pad 5a and connected to the heat conduction pad 5a. The heat conduction pad 5a includes, for example, a metal.

The heat conduction pad 5a may be used for electrical connection with the circuit board 10. For example, the heat conduction pad 5a may be used as a ground wire. That is, in the case where the heat conduction paths 11 are conductors, the heat conduction paths 11 may be connected to a ground wire formed in the circuit board 10, so that the heat conduction paths 11 and the heat conduction pad 5a are electrically and thermally connected to each other. Unlike such an example, the heat conduction pad 5a may not be used for electrical connection with the circuit board 10. That is, the heat conduction paths 11 and the heat conduction pad 5a may be electrically independent of circuitry of the circuit board 10.

As illustrated in FIG. 1, a connecting member 31 for thermally connecting the heat conduction pad 5a and the heat conduction paths 11 may be disposed between the heat conduction pad 5a and the heat conduction paths 11. In the case where both the heat conduction pad 5a and the heat conduction paths 11 include a metal, the connecting member 31 is, for example, solder. That is, in the case where both the heat conduction pad 5a and the heat conduction paths 11 include a metal, they are electrically and thermally connected to each other, for example, by solder. The connecting member 31 is not limited to solder. For example, the connecting member 31 may be thermal grease (also referred to as "heat radiating grease") or a heat conduction sheet. The connecting member 31 is not necessarily limited to thermal grease or a heat conduction sheet as long as the connecting member 31 can be deformed to accommodate a tolerance between the heat conduction paths 11 and the heat conduction pad 5a.

As illustrated in FIG. 1, a connecting member 32 for thermally connecting the heatsink 21 and the heat conduction paths 11 may be disposed between the heatsink 21 and the heat conduction paths 11. The connecting member 32 is, for example, a heat conduction sheet. The heat conduction sheet is elastic in the direction of thickness of the circuit board 10. This ensures connection stability between the heatsink 21 and the heat conduction paths 11 and minimizes exertion of force on the integrated circuit apparatus 5 when the heatsink 21 is pressed against the circuit board 10. A heat conduction sheet including silicone or acrylic resin may be used. The connecting member 32 may be the thermal grease described above. Even in this case, connection stability between the heatsink 21 and the heat conduction paths 11 can be ensured.

Figure 5:
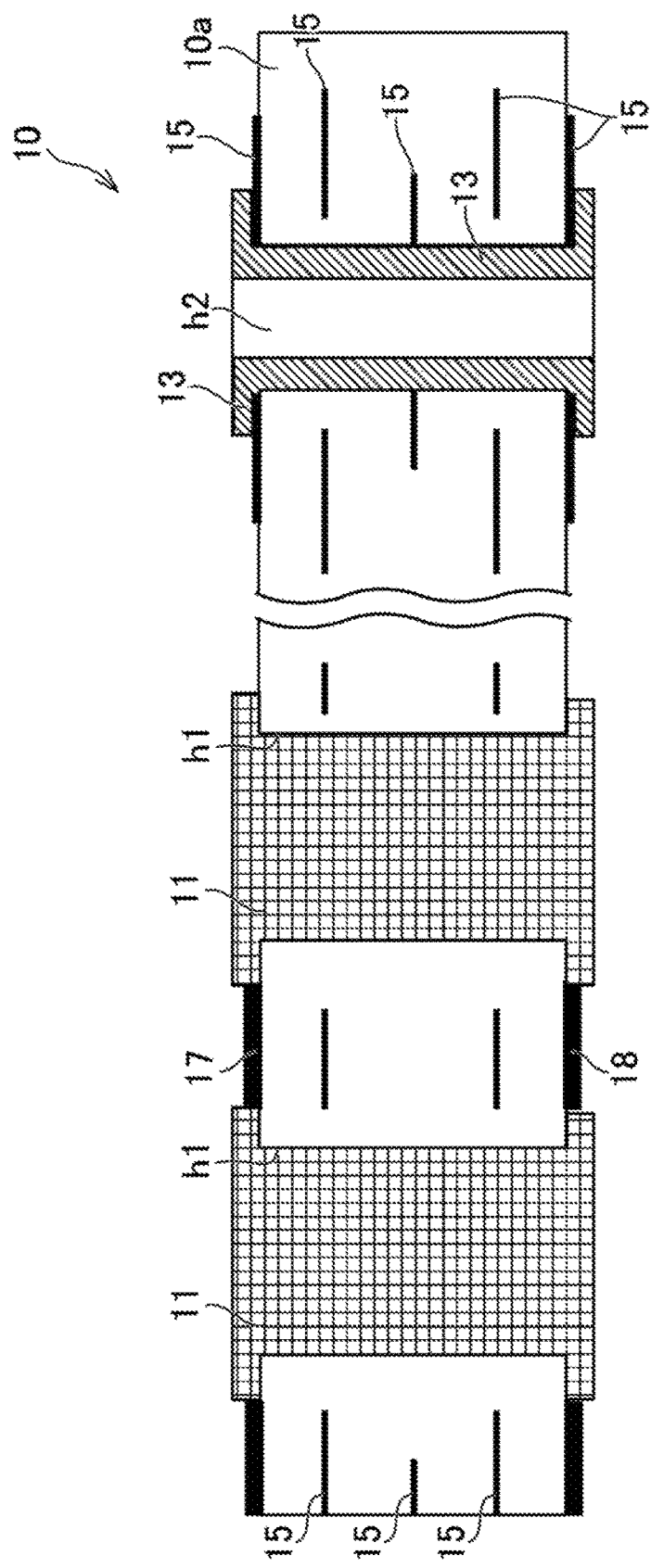
FIG. 5 is a sectional view illustrating a modification example of the circuit board illustrated in FIG. 2A.

FIG. 5 is a diagram illustrating a modification example of the circuit board 10 (in FIG. 5, the same components as those in FIG. 2A are denoted by the same reference signs). In the example illustrated in FIG. 5, the circuit board 10 has a metal layer 18 on its lower surface (surface facing the heatsink 21). The metal layer 18 is formed, for example, over the entire area where the plurality of through holes h1 are formed and connect the plurality of heat conduction paths 11. In the case where the circuit board 10 has the metal layer 18, the heatsink 21 is connected to the metal layer 18. In this case, the heatsink 21 may be in direct contact with the metal layer 18. Alternatively, the connecting member 32 which is the above heat conduction sheet, thermal grease, or another member, may be disposed between the heatsink 21 and the metal layer 18. The metal layer 18 is formed of, for example, the same material as the circuit patterns 15. This allows the metal layer 18 and the circuit patterns 15 (specifically, the circuit patterns 15 formed on the lower surface of the circuit board 10) to be formed by the same process during manufacture of the circuit board 10.

It should be noted that a metal layer 17 for connecting the plurality of heat conduction paths 11 is also formed on the upper surface of the circuit board 10 in the example illustrated in FIG. 5. The metal layer 17 is formed, for example, over the entire area where the plurality of through holes h1 are formed and connects the plurality of heat conduction paths 11. In the case where the circuit board 10 has the metal layer 17, the heat conduction pad 5a of the integrated circuit apparatus 5 is connected to the metal layer 17. In this case, the heat conduction pad 5a may be soldered to the metal layer 17. Instead of soldering, the connecting member 31 which is the above heat conduction sheet, thermal grease, or another member, may be disposed between the heat conduction pad 5a and the metal layer 17. The metal layer 17 is formed of, for example, the same material as the circuit patterns 15. This allows the metal layer 17 and the circuit patterns 15 (specifically, the circuit patterns 15 formed on the upper surface of the circuit board 10) to be formed by the same process during manufacture of the circuit board 10.

Figure 6:
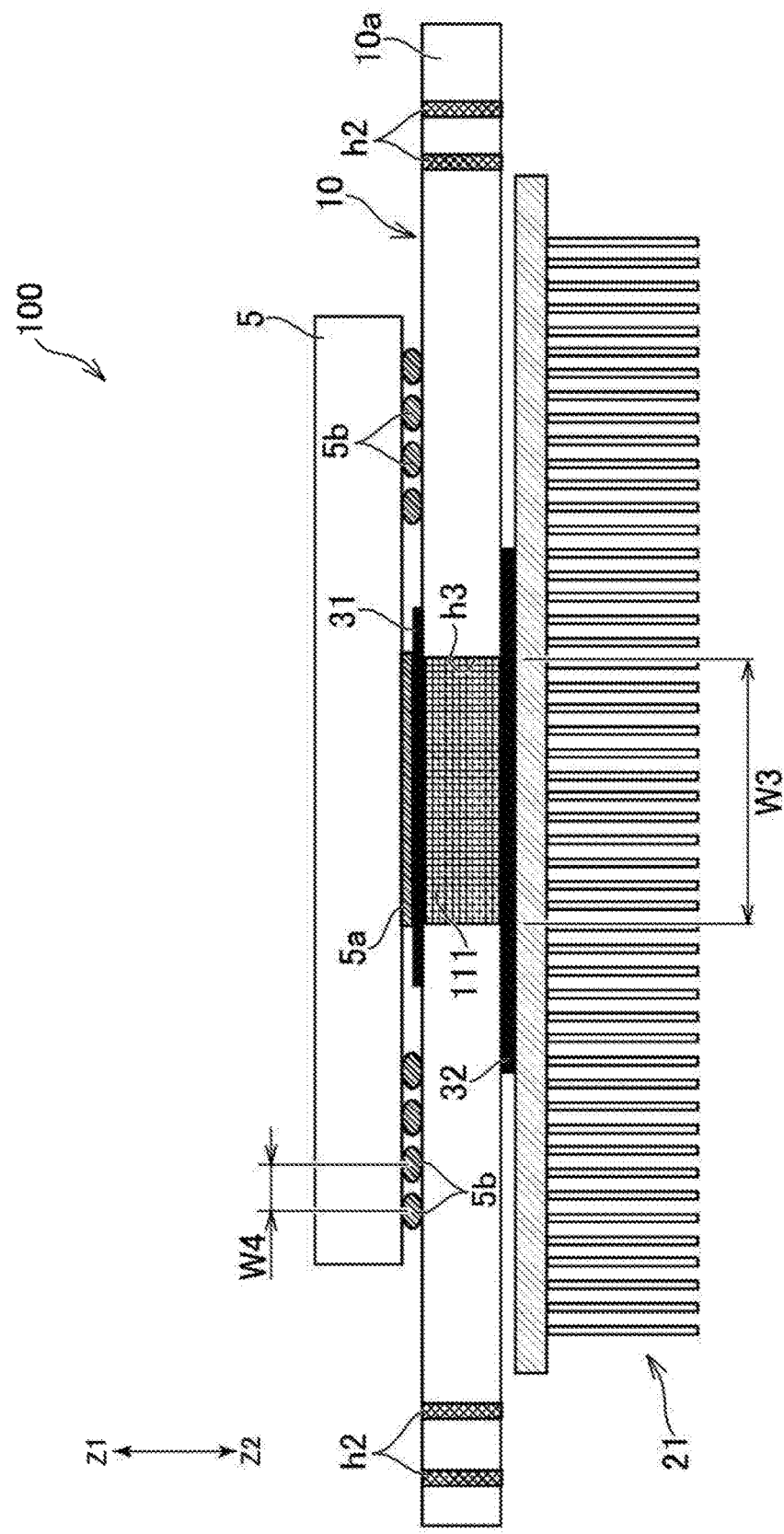
FIG. 6 is a sectional view illustrating a modification example of through holes and the heat conduction paths illustrated in FIGS. 1 and 2A.

FIG. 6 is a sectional view illustrating a modification example of the heat conduction paths 11. In FIG. 6, the same components as those in FIG. 1 are denoted by the same reference signs. In the example of electronic equipment 100 illustrated in FIG. 6, the circuit board 10 has a through hole h3. The through hole h3 has a width W3 greater than the width W2 of the connecting hole h2 described above. More specifically, the width W3 is even greater than a spacing W4 between the two solder balls 5b. The width W3 is greater than half the size of the heat conduction pad 5a of the integrated circuit apparatus 5. The width W3 may substantially fit the width of the heat conduction pad 5a of the integrated circuit apparatus 5. A heat conduction path 111 is filled in the through hole h3. That is, the heat conduction path 111 is formed over the entire area of the through hole h3. The formation of the relatively large through hole h3 allows for even more efficient heat conduction from the integrated circuit apparatus 5 to the heatsink 21.

Figure 7:
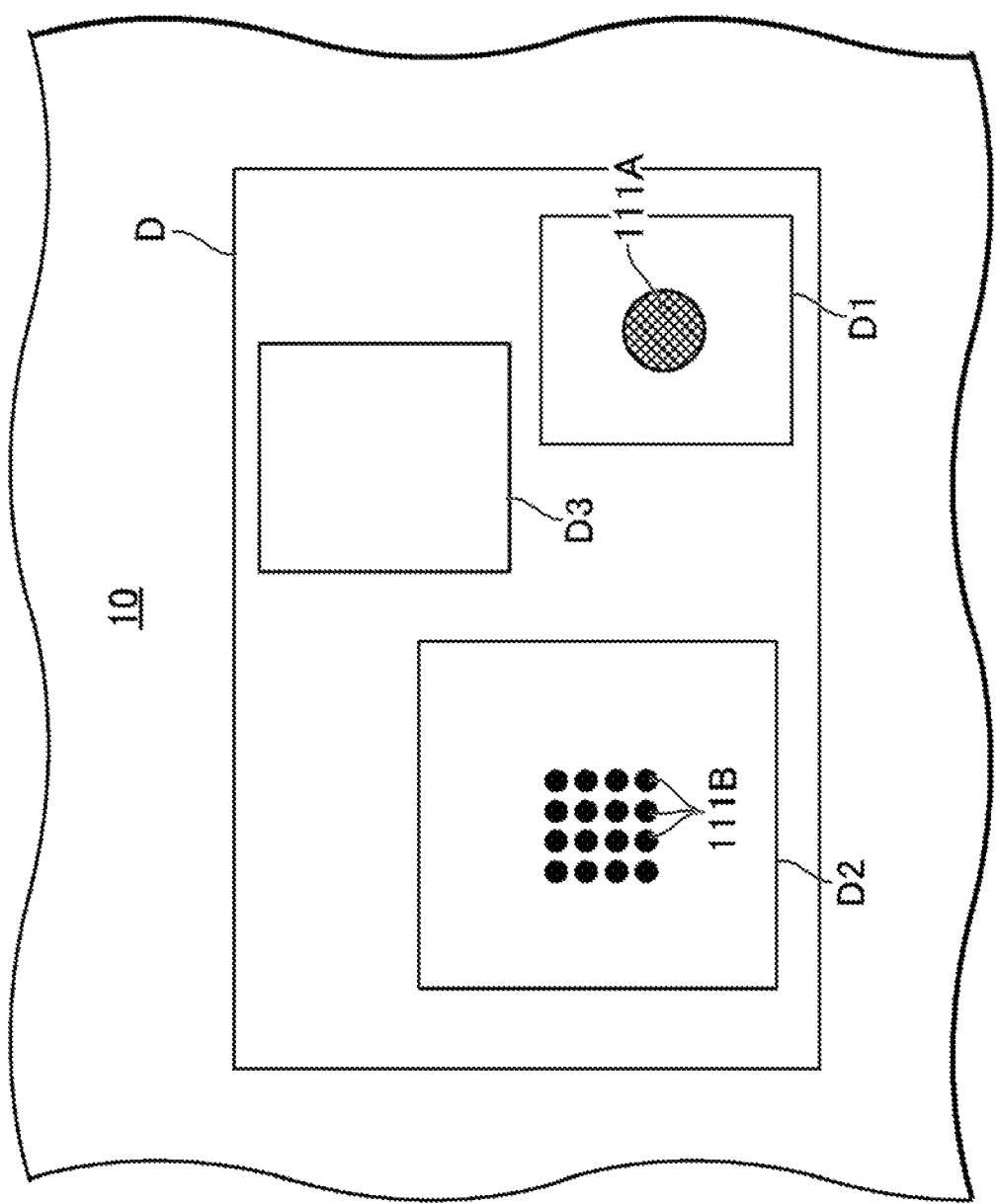
FIG. 7 is a plan view illustrating a modification example of the circuit board illustrated in FIGS. 1 and 2A.

As described above, the integrated circuit apparatus 5 may be a Sip having a plurality of IC chips (silicon die) sealed inside a single package. FIG. 7 is a plan view illustrating an example of the circuit board 10 on which the integrated circuit apparatus 5 as described above is mounted. In the diagram, an area D indicates an area where the integrated circuit apparatus 5 is disposed. Areas D1, D2, and D3 indicate the positions of the plurality of IC chips of the integrated circuit apparatus 5, respectively. In the circuit board 10, heat conduction paths 111A and 111B for connecting the integrated circuit apparatus 5 and the heatsink 21 are formed. The positions of the heat conduction paths 111A and 111B correspond to the positions of the IC chips of the integrated circuit apparatus 5. That is, the heat conduction paths 111A and 111B are located in the areas D1 and D2, respectively. This ensures efficient cooling of the IC chips of the integrated circuit apparatus 5. The heat conduction paths 111A and 111B need not have the same shape. The shapes of the heat conduction paths 111A and 111B may be changed as appropriate to match the positions of the respective IC chips and the circuit patterns 15 formed in the circuit board 10.

It should be noted that heat conduction paths may not be provided for some of the IC chips of the integrated circuit apparatus 5. For example, heat conduction paths may not be provided for those IC chips that generate only a small amount of heat. In the example illustrated in FIG. 7, no heat conduction paths are provided for the IC chips disposed in the area D3.

As described above, in the examples of the electronic equipment 1 and the electronic equipment 100, the heatsink 21 is disposed on the lower surface of the circuit board 10. The circuit board 10 has the through holes h1 and h3 that penetrate the circuit board 10 in the area A where the integrated circuit apparatus 5 is disposed. In the through holes h1 and h3, the heat conduction paths 11, 111, 111A, and 111B are provided. The heat conduction paths 11, 111, 111A, and 111B connect the integrated circuit apparatus 5 and the heatsink 21, allowing heat conduction from the integrated circuit apparatus 5 to the heatsink 21 via the heat conduction paths 11, 111, 111A, and 111B. The heat conduction paths 11, 111, 111A, and 111B include a material having a higher thermal conductivity than the base material 10a of the circuit board 10. These structures of the electronic equipment 1 and the electronic equipment 100 ensure a higher degree of freedom in laying out other components of the electronic equipment. In the case where another heat radiating apparatus is disposed on the upper surface of the integrated circuit apparatus 5 unlike the examples of the electronic equipment 1 and the electronic equipment 100, two heat radiating apparatuses are provided on the integrated circuit apparatus 5, thus contributing to improved cooling performance.

It should be noted that the present invention is not limited to the embodiment described above and may be modified in various manners.

The invention claimed is:
1. An electronic equipment comprising:
a circuit board having a first surface, a second surface, a through hole and a connecting hole, the first surface having an integrated circuit disposed thereon, the second surface being on an opposite side of the first surface, the through hole being formed in an area where the integrated circuit is disposed, the circuit board having a plurality of circuit patterns, the plurality of circuit patterns electrically connected to one another via a conductor formed in the connecting hole, the integrated circuit having a heat conduction pad;
a heat radiating apparatus disposed on the second surface of the circuit board and located on an opposite side of the integrated circuit with the circuit board provided therebetween; and
a heat conduction path filled in the through hole of the circuit board over the entire area of the through hole and adapted to connect the heat conduction pad and the heat radiating apparatus; wherein
the through hole and the connecting hole extend substantially parallel to one another;
the though hole has a width greater than a width of the connecting hole and substantially fitting a width of the heat conduction pad,
an electronic component is disposed on an opposite side of the heat radiating apparatus with the circuit board and the integrated circuit provided between the electronic component and the heat radiating apparatus,
the electronic component, the integrated circuit and the heat radiating apparatus are aligned in a direction of thickness of the circuit board,
a distance between the integrated circuit and the electronic component in the direction of thickness is smaller than a thickness of the heat radiating apparatus in the direction of thickness, and the integrated circuit is not a component of the electronic component.

2. The electronic equipment of claim 1, wherein
the through hole includes a plurality of separate through holes in proximity to one another, which are located in the area and formed in the circuit board, and the width of the through hole is an aggregate of a plurality of individual widths of the plurality of separate through holes, and
the heat conduction path is provided for each of the plurality of through holes.

3. The electronic equipment of claim 2, wherein
an electric wire included in a circuit pattern of the plurality of circuit patterns is formed between two adjacent through holes of the plurality of through holes.

4. The electronic equipment of claim 1, wherein the circuit board includes:
a plurality of layers;
the plurality of circuit patterns formed in each of the plurality of layers; and
the connecting hole adapted to penetrate the circuit board and electrically connect the plurality of circuit patterns, and
when viewed from top, the through hole is larger in size than the connecting hole.

5. The electronic equipment of claim 1, wherein the circuit board includes:
a plurality of layers;
the plurality of circuit patterns formed in each of the plurality of layers; and
the connecting hole adapted to penetrate the circuit board and electrically connect the plurality of circuit patterns, and
when viewed from top, the through hole is wider than the connecting hole.

6. The electronic equipment of claim 1, wherein
the electronic component is an integrated circuit apparatus,
the integrated circuit apparatus has a heat conduction portion on a surface facing the circuit board, and
when the circuit board is viewed from top, the through hole is larger in size than half the heat conduction portion.

7. The electronic equipment of claim 1, wherein
an electric circuit is formed in the circuit board, and
the heat conduction path includes a material having a higher electric resistance than that of the electric circuit.

8. The electronic equipment of claim 1, wherein
an electric circuit is formed in the circuit board, and
the heat conduction path is formed of the same material as the electric circuit.

9. The electronic equipment of claim 1, wherein the heat conduction path is plating formed inside the through hole.

10. The electronic equipment of claim 1, wherein
the electronic component is one or more of a transmission module, a reception module, a sensor, and an external storage apparatus,
the integrated circuit has a heat conduction portion on a surface facing the circuit board, and
the heat conduction path is connected to the heat conduction portion.

11. The electronic equipment of claim 1, wherein at least a heat conduction sheet or thermal grease is disposed between the heat radiating apparatus and the heat conduction path.

12. The electronic equipment of claim 1, wherein the circuit board has, on the second surface, a metal layer connected to the heat conduction path of the through hole and formed integrally with the circuit board.

13. The electronic equipment of claim 1, wherein the heat conduction path includes a material having a higher thermal conductivity than a base material of the circuit board, and the material fills the through hole.

* * * * *